US011022641B1

(12) United States Patent
Perez

(10) Patent No.: US 11,022,641 B1
(45) Date of Patent: Jun. 1, 2021

(54) ELECTRICAL COMPONENT MONITORING CIRCUIT

(71) Applicant: Vulcan Inc., Seattle, WA (US)

(72) Inventor: Keith John Perez, Seattle, WA (US)

(73) Assignee: Vulcan Inc., Seattle, WA (US)

( * ) Notice: Subject to any disclaimer, the term of this patent is extended or adjusted under 35 U.S.C. 154(b) by 262 days.

(21) Appl. No.: 16/208,403

(22) Filed: Dec. 3, 2018

(51) Int. Cl.
| | | |
|---|---|---|
| *G01R 31/00* | (2006.01) | |
| *G01R 33/12* | (2006.01) | |
| *G01R 31/28* | (2006.01) | |
| *H05K 1/02* | (2006.01) | |
| *H05K 1/11* | (2006.01) | |
| *G01R 19/00* | (2006.01) | |

(52) U.S. Cl.
CPC ..... *G01R 31/2815* (2013.01); *G01R 19/0092* (2013.01); *H05K 1/0201* (2013.01); *H05K 1/0289* (2013.01); *H05K 1/11* (2013.01)

(58) Field of Classification Search
CPC .. G01R 15/183; G01R 15/185; G01R 15/202; G01R 15/207; G01R 33/022; G01R 33/04
See application file for complete search history.

(56) References Cited

U.S. PATENT DOCUMENTS

| | | | | |
|---|---|---|---|---|
| 2,961,604 A | * | 11/1960 | Schuchard | G01R 33/022 324/200 |
| 2002/0052665 A1 | * | 5/2002 | Memran | H03F 3/02 700/94 |
| 2004/0002780 A1 | * | 1/2004 | Chang | G06F 3/16 700/94 |
| 2013/0082695 A1 | * | 4/2013 | Johnson | G01R 15/207 324/243 |

* cited by examiner

*Primary Examiner* — Minh N Tang
(74) *Attorney, Agent, or Firm* — Davis Wright Tremaine LLP

(57) ABSTRACT

A modular computer system includes a plurality of circuit modules, each of which includes one or more components that are subject to failure, such as a vacuum tube. A carrier assembly is added to each circuit module of the modular computer system. The carrier assembly hosts monitoring circuitry that indicates the proper functioning of one or more components on the attached module. In one implementation, each module includes a vacuum tube, and a coil located on the carrier assembly is connected in series with the heater of the vacuum tube. A Hall effect sensor is positioned near the coil. If the heater of the vacuum tube fails, the flow of current through the coil is interrupted and is detected by the Hall effect sensor. The Hall effect sensor is connected to an LED that indicates failure of the vacuum tube.

20 Claims, 9 Drawing Sheets

ELECTRICAL COMPONENT MONITORING CIRCUIT

BACKGROUND

Maintaining the reliable operation of an aging modular computer system can be a difficult problem. As a computer system ages, reliability of individual modules that make up the computer system may decline causing the system to become unstable or even practically unusable. For example, computer systems built using vacuum-tube-based modules can be extremely difficult to maintain in an operational state. While running, such computer system may have dozens of modules, each of which relies on the operation of one or more vacuum tubes. Due to the sheer number of vacuum tubes in the computer system, failure of at least one module can be a weekly or daily occurrence. Repair generally involves identifying and replacing the failed vacuum tube or tubes. Since many vacuum tubes do not provide a visual indication of failure, suspect modules and vacuum tubes must be removed, tested, and replaced until the defective units are found. This exhaustive testing of each component by hand is very time-consuming and expensive.

BRIEF DESCRIPTION OF THE DRAWINGS

Various techniques will be described with reference to the drawings, in which.

DETAILED DESCRIPTION

Figure 1:
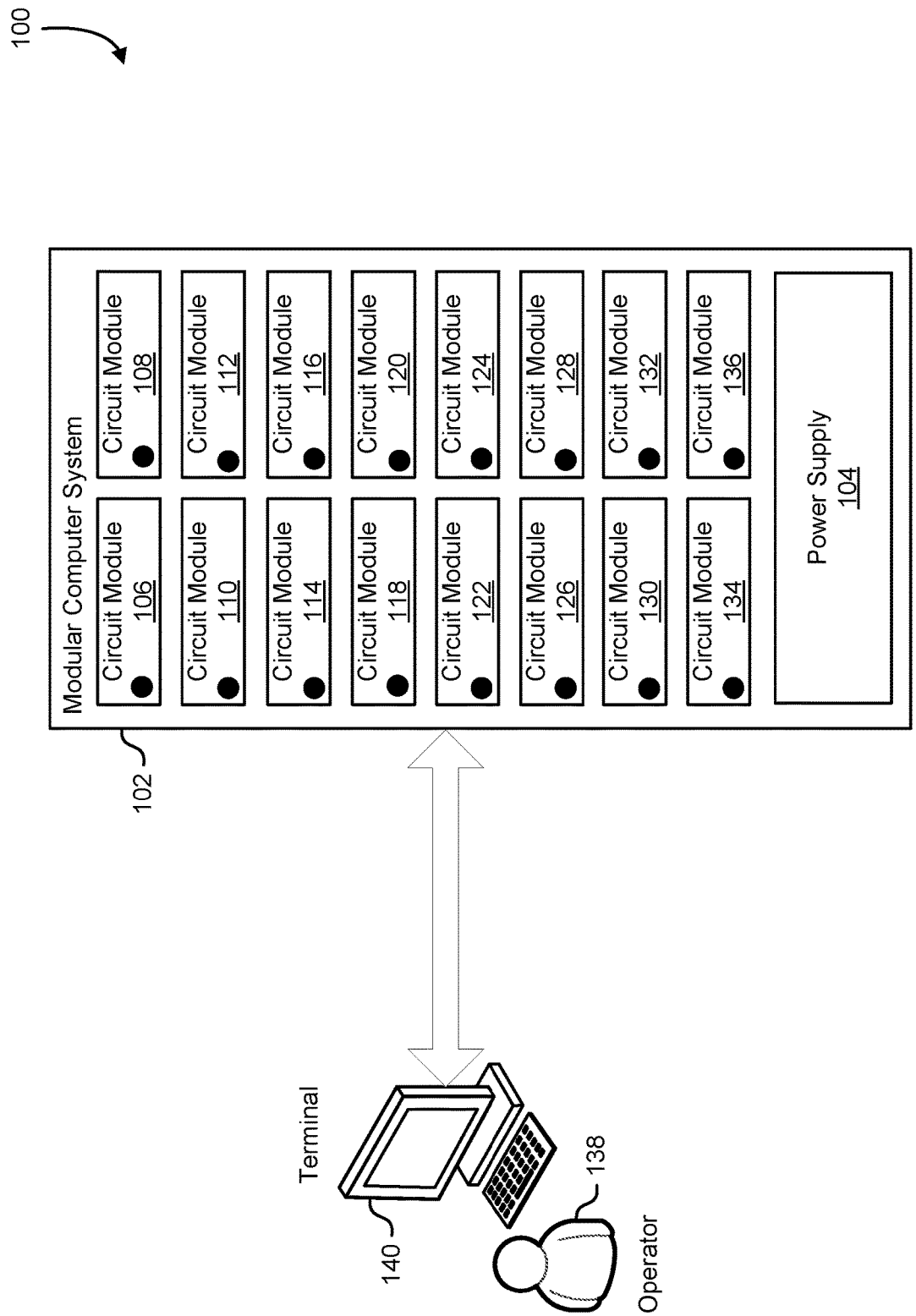
FIG. 1 illustrates an example of a modular computer system, in accordance with an embodiment.

Techniques and systems described below relate to a monitoring circuit that can be added to a computing module of a modular computer system. The monitoring circuit monitors the status of one or more components that are subject to failure (such as a vacuum tube). Upon detecting a failure, the monitoring circuit displays a visible indication that allows the failed module to be quickly identified and repaired by an operator. In some examples, the monitoring circuit causes a hot-swap module to be engaged so the operation of the computer system is uninterrupted. In other examples, the monitoring circuit switches in a replacement component to replace the failed component. In various implementations, the replacement component may be another vacuum tube or a solid state vacuum tube equivalent.

In one example, a modular computer system includes a plurality of pluggable vacuum-tube-based modules that plug into a frame. Each module may include one or more vacuum tubes that are prone to failure. A vacuum tube includes a resistive element or filament called the heater. When energized with an electrical current, the heater emits a stream of electrons which flow from a heated cathode to an anode within the vacuum tube. In some examples, the vacuum tube includes a grid. By applying a voltage to the grid, the flow of electrons from the cathode to the anode may be controlled. In general, a frequent mode of failure for a vacuum tube is for the filament or heater to fail, resulting in an open circuit. With no flow of electrons, the vacuum tube ceases to function and provides no current flow between the anode and the cathode. Some vacuum tubes include more than one filament or heater, and the failure of any one heater element interferes with the operation of the vacuum tube as a whole. Failure of the heater is not always visibly apparent as many vacuum tubes include an endcap or Getter coating at the top of the tube which obscures the view of the heater elements. As a result, without access to the present invention, checking the operation of a module generally requires removing each module from the computer system, removing the vacuum tube elements from the module, testing each vacuum tube outside the system to confirm proper operation, and then reassembling and reinstalling the module. In a computer system with many modules in many vacuum tubes, this can be very time-consuming.

The present document describes a modification to a modular computing device that allows the proper operation of each module to be visually confirmed without removing the module or the vacuum tubes from the computer system. In an embodiment, a carrier assembly is attached to each module. The carrier assembly hosts a set of circuitry that monitors the current flow through the heater element or elements of each vacuum tube on the module. If a heater element fails resulting in an open circuit, an LED is lit that indicates the failure. The LEDs are positioned on the carrier assembly so that the LEDs can be viewed without removing the module or carrier assembly from the computer system. For example, for some computer systems the status of the system can be checked by viewing the back of the machine where the modules are inserted, and any field modules will be clearly indicated by the LEDs.

The current through the heater can be monitored in a number of ways. In one implementation, the connection to each vacuum tube on each module is modified by splicing a coil and field concentrator (such as a wound ferrite core) in series with the heater. When the computer system is turned on and the heater element is active, current flows through the coil and generates a magnetic field in the field concentrator. The magnetic field may be detected using a magnetic field sensor such as a Hall effect sensor, Hall effect switch, Reed switch, or transformer. If a heater fails, current through the corresponding coil is interrupted and the magnetic field sensor triggers an LED to indicate the failure. In one implementation, the magnetic field sensor, coil, and LED are mounted to a carrier assembly on each module, and a board interconnect assembly facilitates the connection of the vacuum tube heater elements to the circuitry on the carrier assembly.

In some examples, additional circuitry may provide an overall status indication that is more conspicuous than the individual LEDs for each heater element. For example, a status light on the front of the modular computer system may be wired to the individual LEDs of each heater element in a "logical OR" configuration providing an overall status indication for the modular computer system. In another example, a vacuum tube may have multiple heater elements, and the status of each heater element may be wired to a single LED that represents the overall status of the individual vacuum tube. In yet another example, a module may have multiple vacuum tubes and the status of the heater elements may be combined to create one overall status LED for the module.

In some examples, the carrier assembly may include fallback circuitry that can replace a failed component. In one example, upon failure of a vacuum tube, the signal generated from the magnetic field detector controls a relay which switches in a substitute component replacing the field vacuum tube. The substitute component may be a replacement vacuum tube, transistor, diode, or solid-state equivalent to the failed component. In some implementations, the entire module may be replaced with a solid-state equivalent or replacement module when failure of the module component is detected.

Techniques described and suggested in the present disclosure improve the field of computing, especially the field of maintaining modular computer systems in an operational state by providing improved visibility of component failure and, in some embodiments, providing redundant failover of legacy components. Additionally, techniques described and suggested in the present disclosure improve the maintainability of computer systems by identifying specific components that have failed. The techniques described and suggested in the present disclosure are particularly well-suited to the maintenance and operation of legacy computer systems based on vacuum tubes or other components that are prone to failure.

FIG. 1 illustrates an example of a modular computer system, in accordance with an embodiment. In FIG. 1, an environment 100 includes a modular computer system 102. The modular computer system includes a power supply 104 and a number of circuit modules 106, 108, 110, 112, 114, 116, 118, 120, 122, 124, 126, 128, 130, 132, 134, and 136. A circuit module is a pluggable part of a computer system that includes one or more electrical components. Examples of circuit modules include the circuit boards that plug into a Bendix G-15. Circuit modules may often be used for vacuum-tube-based computer systems so that parts of the computer system (the modules) can be removed, tested, and repaired separately. Each circuit module is pluggable into a frame of the modular computer system. In an embodiment, the modular computer system 102 is a Bendix G-15 that includes a magnetic drum that implements a delay line memory. In some examples, the modular computer system 102 implements accumulators and processing circuitry that facilitates the execution of executable instructions. The system includes a typewriter 140 that can be operated by an operator 138. In various examples, the typewriter may be used as an input/output device by the modular computer system 102. In some examples, programs are loaded into the modular computer system 102 from non-volatile storage which may include magnetic disk memory, optical storage, magnetic cards, punch cards, paper tape, or solid state memory devices.

Each circuit module includes one or more components that are monitored for proper operation. The monitored components may include vacuum tubes, light bulbs, fuses, power transistors or diodes, power supplies, voltage regulators, coils, or other current-drawing electrical component. In some examples, each circuit module includes one or more vacuum tubes, and the heater element (or elements) of the one or more vacuum tubes are monitored to ensure they are not burned out.

In one implementation, circuitry for monitoring each circuit module is hosted on a carrier circuit board assembly mounted to each circuit module. The carrier circuit board assembly includes an indicator that is positioned to be visible from outside the modular computer system 102 while the circuit module is installed. In one example, the carrier circuit board assembly is mounted parallel to the circuit board of the circuit module, and an LED is mounted on the end of the carrier circuit board so that it is visible when the circuit module is installed in the modular computer system 102. The carrier circuit board assembly includes a current monitoring circuit that is wired in series with the components to be monitored. In one embodiment, the current monitoring circuit is a coil magnetically coupled to a Hall effect sensor that detects when current is flowing through the coil (and therefore the component being monitored). Magnetic coupling may be accomplished by positioning the coil and the sensor relative to each other such that a magnetic field generated by the coil is detectable by the Hall effect sensor. In some implementations, the current sensor includes a magnetic flux concentrator such as an iron core or ferrite core to direct the magnetic flux to the Hall effect sensor. A variety of Hall effect sensors may be used such as proportional Hall effect sensors, Hall effect switches, or Hall effect latches. Examples of suitable Hall effect sensors include Diodes Incorporated AH 337-WG-7, Melexis Technologies US5881ESE-AAA-000-RE, and Infineon Technologies TLE4906KHTSA1.

The coil may be constructed based on the amount of current flowing through the component to be monitored. In one implementation, the component to be monitored is a vacuum tube heater element that draws between 75 and 150 mA of current. In one example, the coil is made with 150 turns of #34 magnet wire and has a 3.5 ohm resistance. In one embodiment, the coil is made with between 125 and 175 turns of wire around a ferrite core. The wire is would around a Laird 28B0375-400 ferrite 81 ohm solid 5.08 mm core that has been modified by cutting a 1.6 mm slot in the core. A hall-effect sensor is glued into the slot.

In various examples, each circuit module of the modular computer system 102 is modified by wiring the current sensor in series with the component to be monitored. The connections to the component to be monitored may be established via a board interconnect between the circuit module and the carrier circuit board assembly. With the carrier circuit board assembly installed on the circuit module, current flows through the current sensor on the carrier circuit board assembly through the interconnect and through the component to be monitored on the circuit module. Operation of the circuit module is unimpaired by the monitoring circuitry, and failure of the monitoring component is detectable without removing the circuit module for testing.

If the component being monitored fails, current through the coil is interrupted and the magnetic coupling between the Hall effect sensor and the coil is broken. The output of the Hall effect sensor changes, causing a change to an indicator coupled to the output of the Hall effect sensor. In some embodiments, the indicator is a light emitting diode. In other embodiments, the indicator may be a light, an LCD, a Piezo electric alarm, a buzzer, or visible or audible indicator. The indicator is mounted so that it is perceivable by the operator 138 without removing the associated circuit module from the modular computer system 102. In some examples, the indicator is an LED mounted on the edge of the carrier circuit board assembly. In other examples, the indicator is an LED with a light pipe directed to the outside of the modular computer system 102.

By adding monitoring circuitry to each circuit module of the modular computer system 102, operation of the modular computer system 102 may be greatly simplified. For example, for a vacuum tube computer system such as the Bendix G-15, failure of a component is a relatively common occurrence. Without the described monitoring circuitry, each individual circuit module would be removed and tested to identify the faulty component and return the machine to proper operation. However, with monitoring circuitry installed on each circuit module, identification of a failed circuit module is visually evident without removing any modules from the machine. Therefore, the operator 138 is able to quickly determine whether any of the circuit modules has failed and facilitate a repair if necessary.

Although the present document describes the invention in the context of improving the testability of components in a modular computer system, those skilled in the art will appreciate that the invention is also applicable to other electrical systems that rely on one or more relatively unreliable or critical components that are subject to failure. For example, various embodiments can be used to monitor fuses, indicator lights, heater elements, filaments, sensor elements (such as those present in mass airflow sensor devices), or the continuity of an electrical connection.

Figure 2:
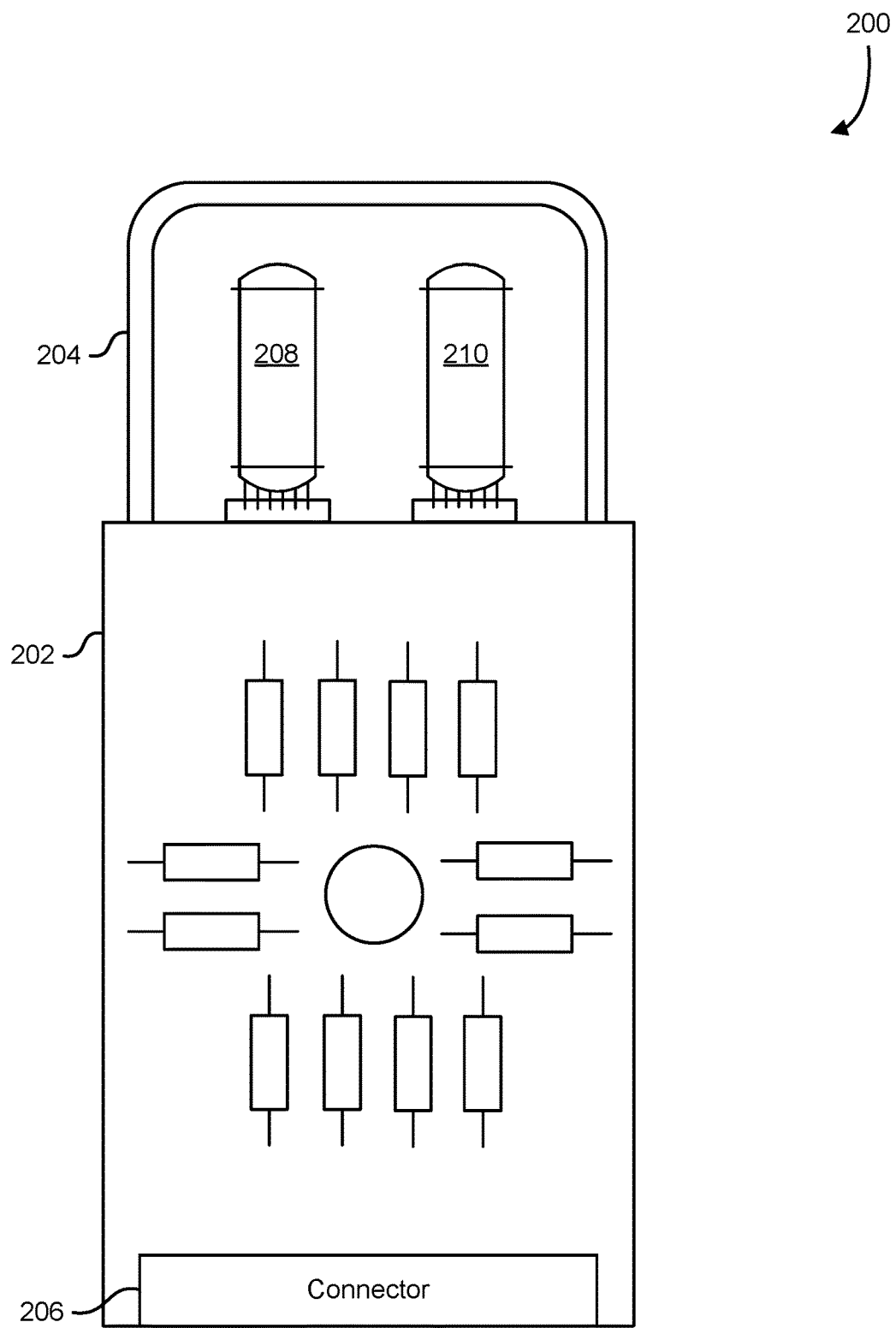
FIG. 2 illustrates an example of a circuit module of a modular computer system, in accordance with an embodiment.

FIG. 2 illustrates an example of a circuit module 200 of a modular computer system, in accordance with an embodiment. The circuit module 200 illustrated in FIG. 2 is one of a plurality of circuit modules that can be inserted into the modular computer system. The circuit module 200 comprises a circuit board 202 that houses a variety of electrical components, a handle 204, which facilitates insertion and removal into the modular computer system, and an edge connector 206 that provides an electrical interface to a corresponding receptacle on the modular computer system. In some embodiments, the modular computer system includes a set of rails that guide the edges of the circuit board as the circuit module 200 is inserted into the modular computer system, thereby aligning the edge connector 206 to the matching receptacle on the modular computer system.

The circuit module 200 may include one or more vacuum tubes or other components to be monitored. In the example shown in FIG. 2, the circuit module 200 includes a first vacuum tube 208 and a second vacuum tube 210. The circuit module 200 may include vacuum tubes of various types including single filament or dual filament vacuum tubes, diodes, triodes, tetrodes, pentodes, multifunction or multisection vacuum tubes. Each vacuum tube includes one or more heater elements. As is well known to those of skill in the art, vacuum tubes are prone to a variety of failure modes, one of which is the failure of the heater element. In many examples, the heater element can fail, resulting in an open circuit.

In various examples, the circuit module 200 may include various DC current-drawing component types that are subject to failure. Examples of such components may include fuses, filament-based lights, vacuum tube heaters, circuit breakers, switches, coils, voltage regulators, diodes, and power transistors. For a modular computer system containing a large number of pluggable circuit modules, reliability of the modular computer system generally declines as the number of pluggable circuit modules increases. For example, if each circuit module has a failure rate n, the failure rate of the modular computer system is generally $(1-n)^x$, where X is the number of circuit modules in the modular computer system. Often, the failure of an electrical component provides no visual indication of component failure. Therefore, repair of the modular computer system often requires removal and testing of each circuit module individually. This can be a very time-consuming and tedious process.

Figure 3:
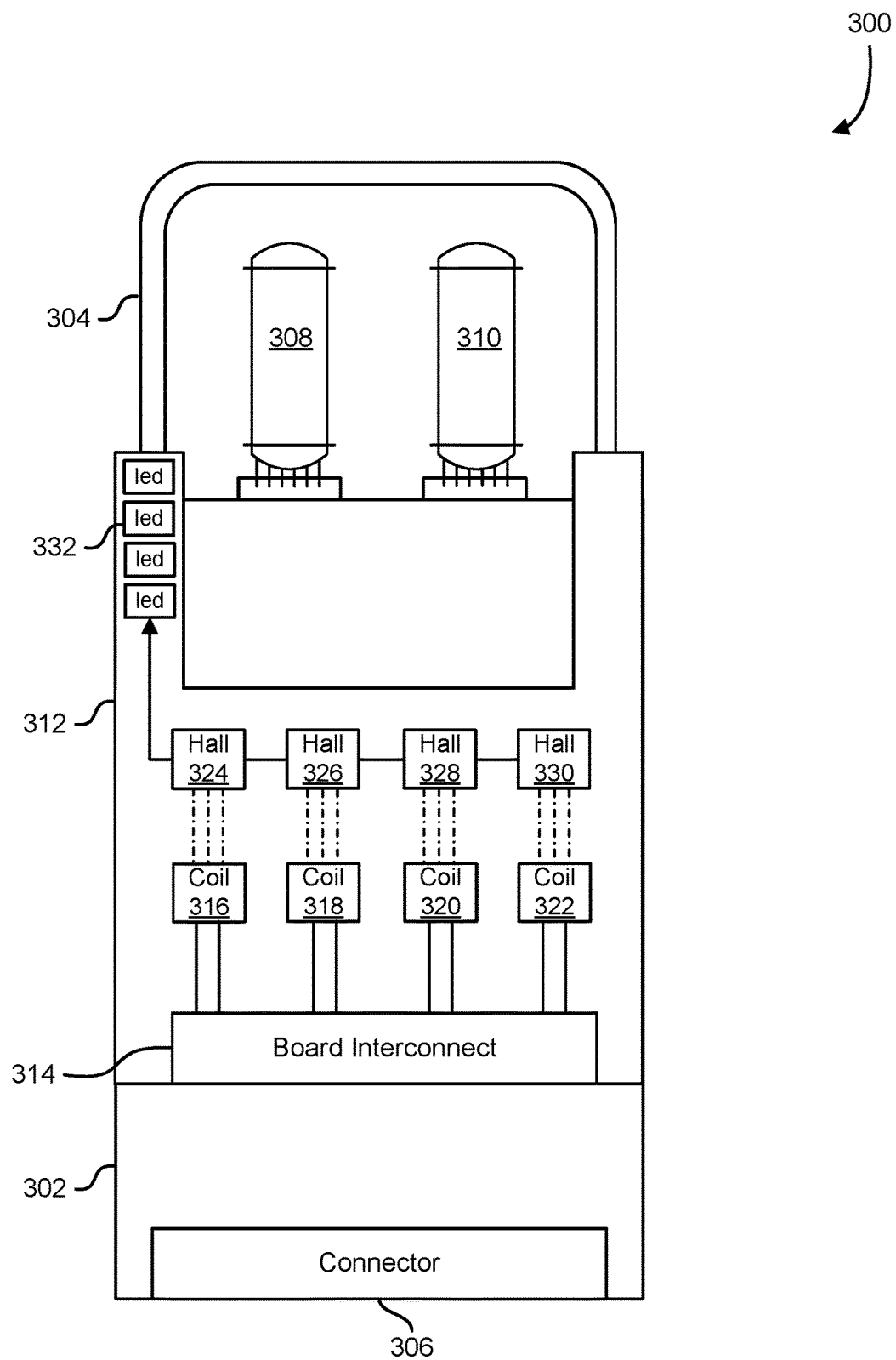
FIG. 3 illustrates an example of a circuit module with a carrier assembly that hosts a circuit which monitors the status of the module, in accordance with an embodiment.

FIG. 3 illustrates an example of a circuit module 300 with a carrier assembly that hosts a circuit which monitors the status of the module, in accordance with an embodiment. The carrier assembly is mounted to the circuit module 300 and provides a visual indication if a component on the circuit module fails. The circuit module 300 comprises a circuit board 302 that houses a variety of electrical components, a handle 304, which facilitates insertion and removal into a modular computer system, and an edge connector 306 that provides an electrical interface to a corresponding receptacle on the modular computer system. In some embodiments, the modular computer system includes a set of rails that guide the edges of the circuit board as the circuit module 300 is inserted into the modular computer system, thereby aligning the edge connector 306 to the matching receptacle on the modular computer system.

The circuit module 300 may include one or more vacuum tubes or other components to be monitored. In the example shown in FIG. 3, the circuit module 300 includes a first vacuum tube 308 and a second vacuum tube 310. The circuit module 300 may include vacuum tubes of various types including single filament or dual filament vacuum tubes, diodes, triodes, tetrodes, pentodes, multifunction or multisection vacuum tubes. Each vacuum tube includes one or more heater elements. As is well known to those of skill in the art, vacuum tubes are prone to a variety of failure modes, one of which is the failure of the heater element. In many examples, the heater element can fail, resulting in an open circuit.

In FIG. 3, a carrier assembly is mounted to the circuit module 300. The carrier assembly hosts a set of monitoring circuitry that monitors the operation of the first vacuum tube 308 and the second vacuum tube 310. The carrier assembly comprises a bracket that connects a carrier circuit board 312 to the circuit board 302. The carrier circuit board 312 includes a board interconnect 314. The board interconnect 314 can be a ribbon cable socket, edge connector, or other connector that facilitates the connection between circuitry on the carrier circuit board 312 and a component of the circuit module to be monitored. In some examples, the components to be monitored are the heater elements of the first vacuum tube and the heater elements of the second vacuum tube.

In various embodiments, circuitry on the carrier circuit board 312 is configured to provide current monitoring through the monitored components. In one example, pins on the board interconnect are wired in series with the heater element on one of the vacuum tubes so the current through the heater element can be monitored by the current monitoring circuit on the carrier circuit board 312. A current monitoring circuit may be created by directing the current of the monitored components through a coil. The coil generates a magnetic field which can be monitored by a Hall effect sensor. In the example shown in FIG. 3, the carrier circuit board includes a first coil 316, a second coil 318, a third coil 320, and a fourth coil 322. Each coil is capable of monitoring the current through a component on the circuit board 302. Corresponding Hall effect sensors monitor the magnetic field created when current is flowing through one of the coils. The magnetic field generated by the first coil 316 is monitored by a first Hall effect sensor 324. The magnetic field generated by the second coil 318 is monitored by a second Hall effect sensor 326. The magnetic field generated by the third coil 320 is monitored by a third Hall effect sensor 328. The magnetic field generated by the fourth coil 322 is monitored by a fourth Hall effect sensor 330.

When current is flowing through the component being monitored, current is also flowing through the corresponding coil on the carrier circuit board 312. The current generates a magnetic field which is detected by a Hall effect sensor. An output of the Hall effect sensor may be connected to an indicator to indicate proper operation of the components. In the example illustrated in FIG. 3, the carrier circuit board 312 includes a set of indicator LEDs 332. The output of each Hall effect sensor is connected to one of the indicator LEDs 332. The indicator LEDs 332 are positioned on the edge of the carrier assembly so that they are visible when the module is installed on a modular computer system. This allows an operator to view the state of the monitored components without removing the individual modules from the modular computer system for testing.

In various embodiments, different numbers of components may be monitored. In other implementations, the current monitoring circuits may be implemented using an operational amplifier, a latching coil sensor, a resistor and voltage sensor, or other mechanism. In some implementations, the indicator LEDs 332 may be combined to provide a combined status. For example, the output of the Hall sensors may be wired to a single LED which is lit when any of the components being monitored fails. In some examples, a second board interconnect is present on the carrier circuit board 312, and a single wire provides an overall status indication for the circuit module. The status wires of multiple circuit modules can be combined to provide a single indicator for the overall status of the modular computer system.

Figure 4:
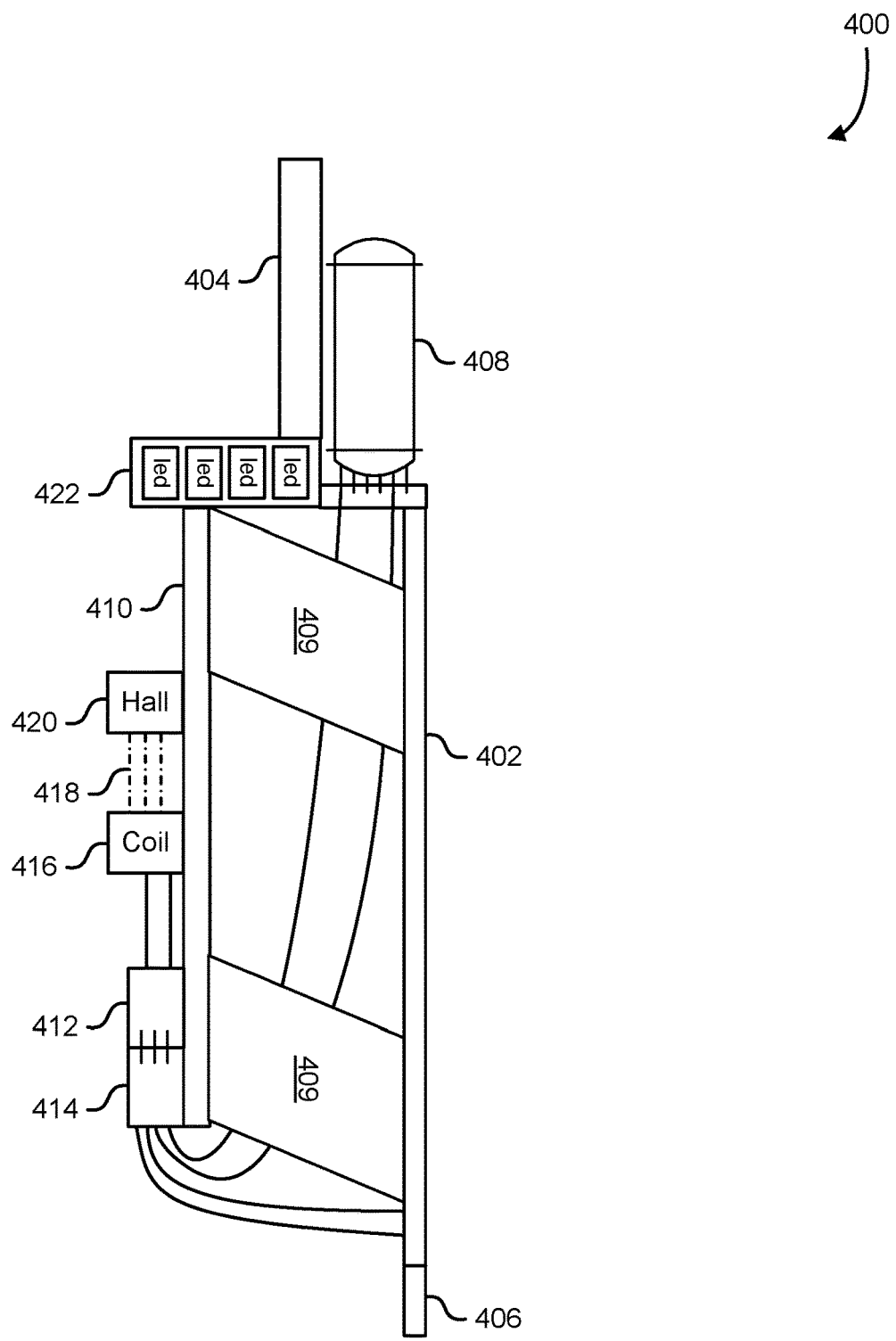
FIG. 4 illustrates an example of a carrier assembly and monitoring circuit, in accordance with an embodiment.

FIG. 4 illustrates an example of a carrier assembly and monitoring circuit, in accordance with an embodiment. A modified circuit module 400 comprises a circuit board 402 with a variety of electrical components, a handle 404 that facilitates insertion and removal into a modular computer system, and an edge connector 406 that provides an electrical interface to a corresponding receptacle on the modular computer system. In some embodiments, the circuit module 400 is inserted into the modular computer system by aligning the edge connector 406 to the matching receptacle on the modular computer system. The modified circuit module 400 may include one or more vacuum tubes or other components to be monitored. In FIG. 4, the modified circuit module 400 includes a vacuum tube 408.

In various examples, a carrier assembly is mounted to the modified circuit module 400 using a pair of brackets 409. The carrier assembly hosts a set of monitoring circuitry that monitors the operation of the vacuum tube 408. The carrier assembly comprises a pair of brackets 409 that connect a carrier circuit board 410 to the circuit board and 402. The carrier circuit board 410 includes a board interconnect 412. The board interconnect 412 can be a ribbon cable socket, edge connector, or other connector that facilitates the connection between circuitry on the carrier circuit board 410 and a component of the circuit module to be monitored. In some examples, the components to be monitored are the heater elements of the first vacuum tube and the heater elements of the second vacuum tube. A corresponding plug 414 makes the connection between the component to be tested and the carrier circuit board 410.

In various embodiments, circuitry on the carrier circuit board 410 is configured to provide current monitoring through the monitored components. In one example, pins on the board interconnect are wired in series with the heater element on one of the vacuum tubes so the current through the heater element can be monitored by the current monitoring circuit on the carrier circuit board 410. A current monitoring circuit may be created by directing the current of the monitored components through a coil. The coil generates a magnetic field which can be monitored by a Hall effect sensor. In the example shown in FIG. 4, the carrier circuit board includes a coil 416 that generates a magnetic field 418 which is detected by a Hall effect sensor 420. The coil 416 is configured in series with the component to be tested so that the current through the coil matches the current through the heater of the vacuum tube 408.

When current is flowing through the heater of the vacuum tube 408, current is also flowing through the coil 416 on the carrier circuit board 410. The current generates a magnetic field 418 which is detected by the Hall effect sensor 420. An output of the Hall effect sensor 420 is connected to an indicator that indicates that the heater of the vacuum tube 408 is functioning properly. The carrier circuit board 410 includes a set of indicator LEDs 422. The indicator LEDs 422 are positioned on the edge of the carrier assembly so that they are visible when the module is installed on a modular computer system. This allows an operator to view the state of the monitored components without removing the individual modules from the modular computer system for testing. Various types of indicators may be substituted for the indicator LEDs 422 such as light bulbs, buzzers, or LCD displays.

Figure 5:
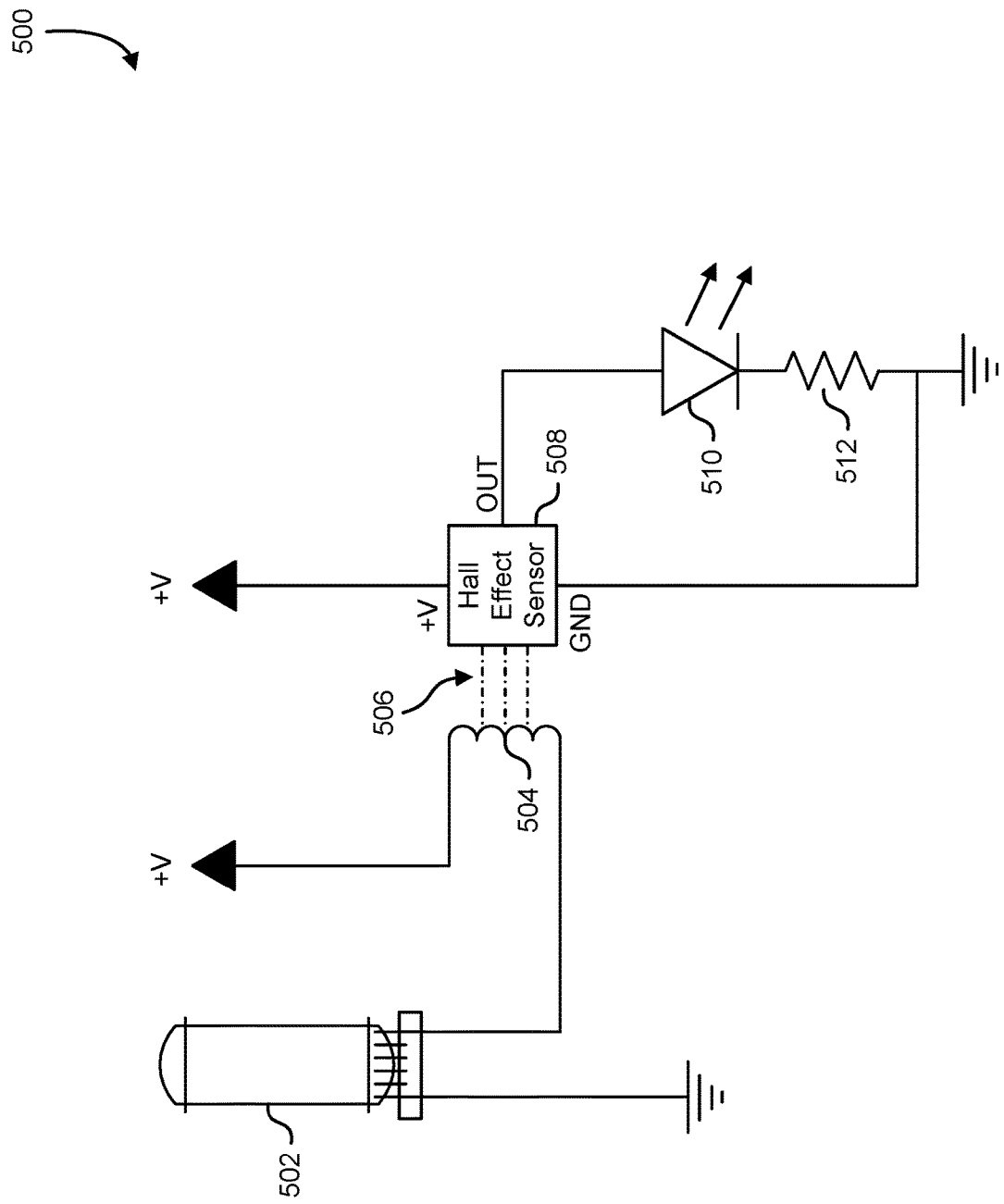
FIG. 5 illustrates an example of a monitoring circuit that provides an indication of component failure, in accordance with an embodiment.

FIG. 5 illustrates an example of a monitoring circuit 500 that provides an indication of component failure, in accordance with an embodiment. The monitoring circuit 500 is configured to monitor the operation of the heater element of the vacuum tube 502. In other embodiments, the monitoring circuit 500 may be used to monitor the current through other components such as coils, fuses, lightbulbs, heaters, motors, or resistors. The monitoring circuit provides an indication of whether current is flowing through the component being monitored.

In one example, the monitoring circuit includes a coil 504 that is wired in series with the heater element of the vacuum tube 502. Current flows from the positive rail through the coil 504 and through the heater element of the vacuum tube 502. In many examples, the DC resistance of the coil 504 is negligible compared to the resistance of the heater element of the vacuum tube 502. As a result, operation of the vacuum tube 502 is generally not adversely affected. The design of the coil 504 is based on the amount of current expected to flow through the vacuum tube 502 (or other component to be monitored).

When the vacuum tube 502 is operating, current through the coil 504 generates a magnetic field 506 which can be detected by a Hall effect sensor 508. The Hall effect sensor 508 is positioned so that it is exposed to the magnetic field 506. In some implementations, the magnetic field 506 is concentrated and directed to the Hall effect sensor 508 using an iron or ferrite core in conjunction with the coil 504. In the embodiment shown in FIG. 5, the Hall effect sensor 508 is a switch type sensor. Those skilled in the art will appreciate that with appropriate modifications, other types of Hall effect sensors can be used including latching type sensors or analog output Hall effect sensors.

The output of the Hall effect sensor 508 is connected to a light emitting diode 510 and current-limiting resistor 512. When current is flowing through the heater of the vacuum tube 502, current flows through the coil 504, causing the output of the Hall effect sensor 508 to be raised. As a result, current flows through the light emitting diode 510, providing an indication that the heater of the vacuum tube 502 is operating properly.

Figure 6:
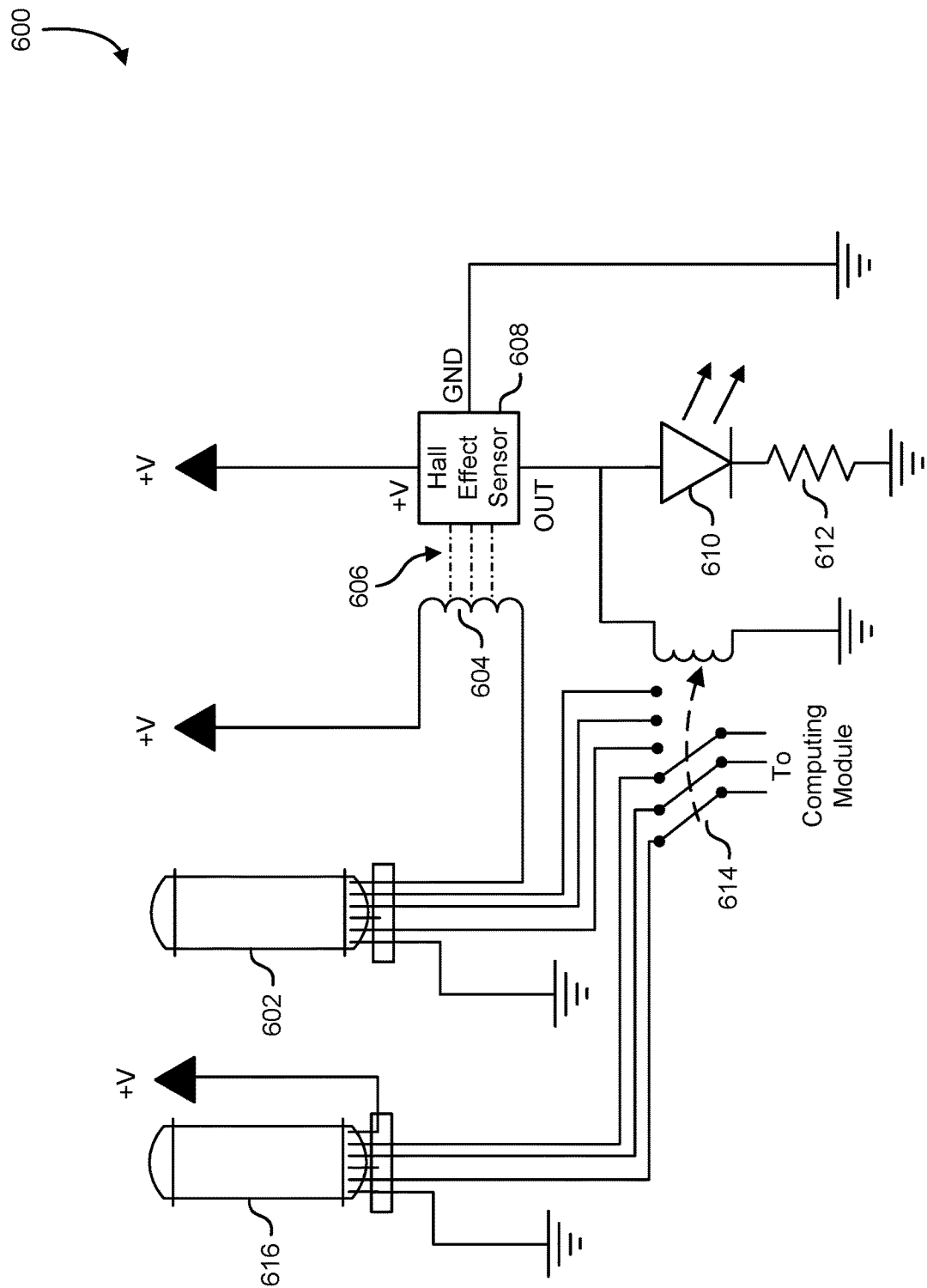
FIG. 6 illustrates an example of a monitoring circuit that provides a redundant component fallback feature, in accordance with an embodiment.

FIG. 6 illustrates an example of a monitoring circuit 600 that provides a redundant component fallback feature, in accordance with an embodiment. The monitoring circuit 600 monitors the operation of a first vacuum tube 602. If the heater element of the first vacuum tube 602 fails, the monitoring circuit 600 detects the failure, provides an indication of the failure, and engages a redundant component to replace the failed vacuum tube. To monitor the first vacuum tube 602, the heater of the first vacuum tube 602 is wired in series with a coil 604. The number of windings and construction of the coil is based on the operational current of the vacuum tube heater. The coil may include a ferrite core or other field concentrator to direct the magnetic field 606 to a Hall effect sensor 608.

In the event that the heater of the first vacuum tube 602 fails, current is interrupted through the coil 604 and the magnetic field 606 dissipates. As a result, the output of the Hall effect sensor 608 is driven high, sending current through an LED 610 and current-limiting resistor 612. The current-limiting resistor 612 controls the amount of current passing through the LED 610. For example, if the supply voltage is 6 V, and the LED voltages 1.2 V, the current-limiting resistor 612 should have a value of approximately 100 ohms to limit the current through the LED to 50 mA.

Engaging the backup component is accomplished by way of a relay 614. When the heater of the first vacuum tube 602 fails, the output of the Hall effect sensor 608 is driven high, driving current through the coil of the relay 614. The relay 614 switches the control connections of the computing module from the first vacuum tube 602 to a second vacuum tube 616. In one embodiment, the second vacuum tube 616 is kept in a warmed-up state, and only the control connections are switched when failure of the first vacuum tube 602 is detected. In another embodiment, the second vacuum tube 616 is not energized unless the first vacuum tube 602 fails. In yet another embodiment, the second vacuum tube 616 may be a solid-state equivalent of the first vacuum tube 602. Solid-state equivalents for a vacuum tube may include a diode, transistor, field-effect transistor ("FET"), or junction gate field-effect transistor ("JFET").

By providing an automatic backup for a failed component, the circuit module equipped with a monitoring circuit 600 (or an equivalent) is able to function more reliably even when based on inherently unreliable components such as vacuum tubes. For example, this allows for the reliable operation and demonstration of legacy computer systems for museums. In another example, by allowing for the operation of legacy computer systems, access to historical data and programs can be facilitated.

Figure 7:
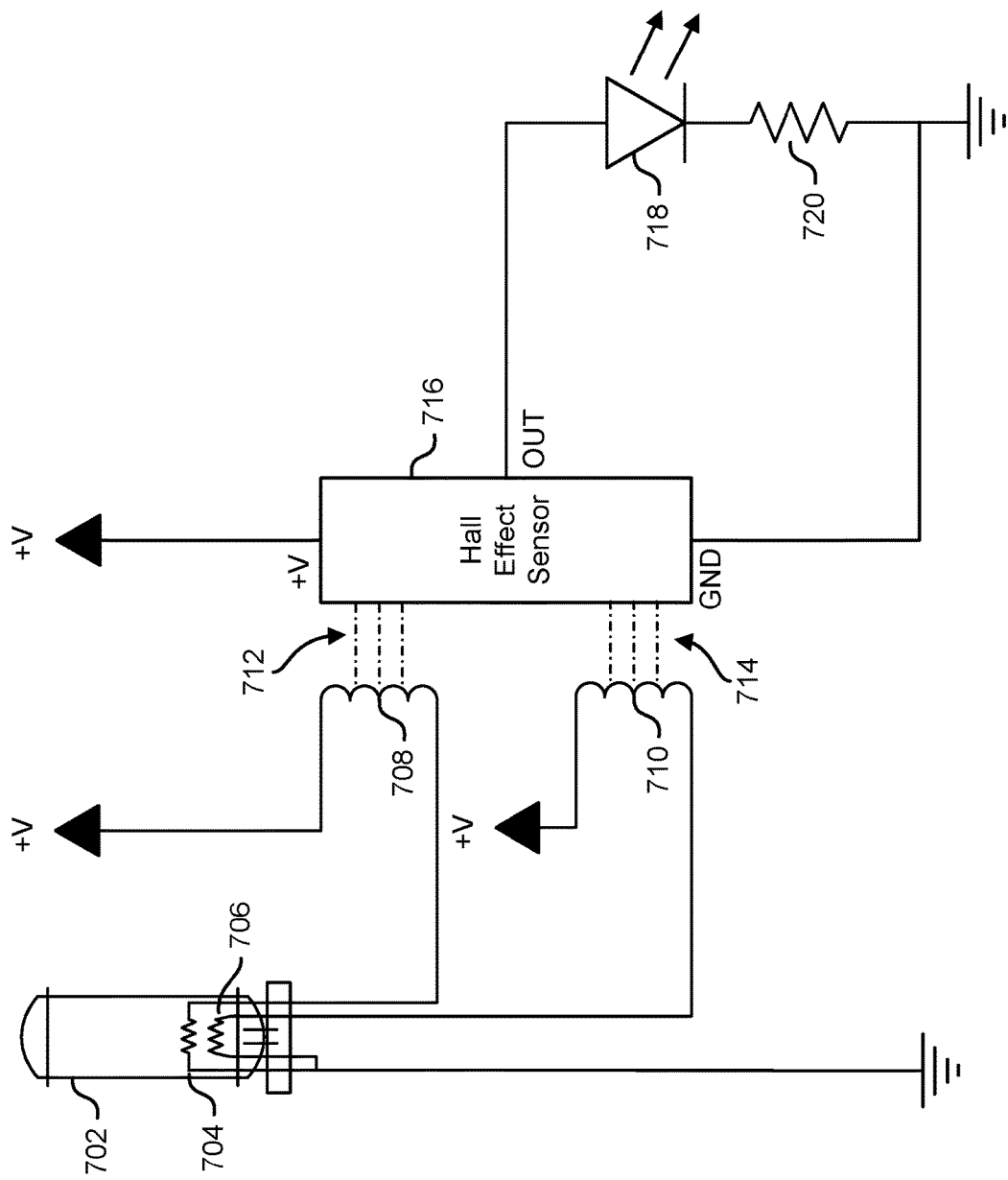
FIG. 7 illustrates an example of a monitoring circuit that provides monitoring of a dual heater vacuum tube component, in accordance with an embodiment.

FIG. 7 illustrates an example of a monitoring circuit 700 that provides monitoring of a dual heater vacuum tube component, in accordance with an embodiment. Some vacuum tubes contain more than one heater element. In the example illustrated in FIG. 7, a dual element vacuum tube 702 includes a first heater element 704 and the second heater element 706. Each heater element is powered independently. The first heater element 704 is wired in series with the first coil 708. The second heater element 706 is wired through a second coil 710. Both the first coil and the second coil are constructed with a number of turns that is based on the current that flows through the respective heater element.

When the first heater element 704 is energized, current flows through the first coil 708, generating a first magnetic field 712. When the second heater element 706 is energized, current flows through the second coil 710, generating a second magnetic field 714. In one embodiment, the first coil 708 and the second coil 710 are positioned to direct the first magnetic field 712 and the second magnetic field 714 to a Hall effect sensor 716. In another embodiment, the first coil 708 and the second coil 710 are wound around a common core that directs a combined magnetic field that includes the first magnetic field 712 and the second magnetic field 714 to the Hall effect sensor 716. The Hall effect sensor 716 is adjusted so that if the amount of magnetic flux falls below the sum of the first magnetic field 712 and the second magnetic field 714, the output of the Hall effect sensor 716 is energized, driving current through a light emitting diode 718 and current limiting resistor 720. In this way, the failure of either or both heating elements will light the light emitting diode 718. In other embodiments, separate Hall effect sensors and LEDs may be used to provide separate status indications for each heater element.

A plurality of components may be monitored by linking a plurality of coils magnetically to a single Hall effect sensor. For example, a circuit module with four vacuum tubes each having a single heater element could be monitored using four coils magnetically coupled to a single Hall effect sensor by wrapping each coil around a common core directed at a single Hall effect sensor. For an analog output Hall effect sensor, the output value would be proportional to the total amount of current through all the heater elements of the four vacuum tubes. Failure of any particular vacuum tube could be detected using a voltage comparator calibrated to trigger at an appropriate level.

Figure 8:
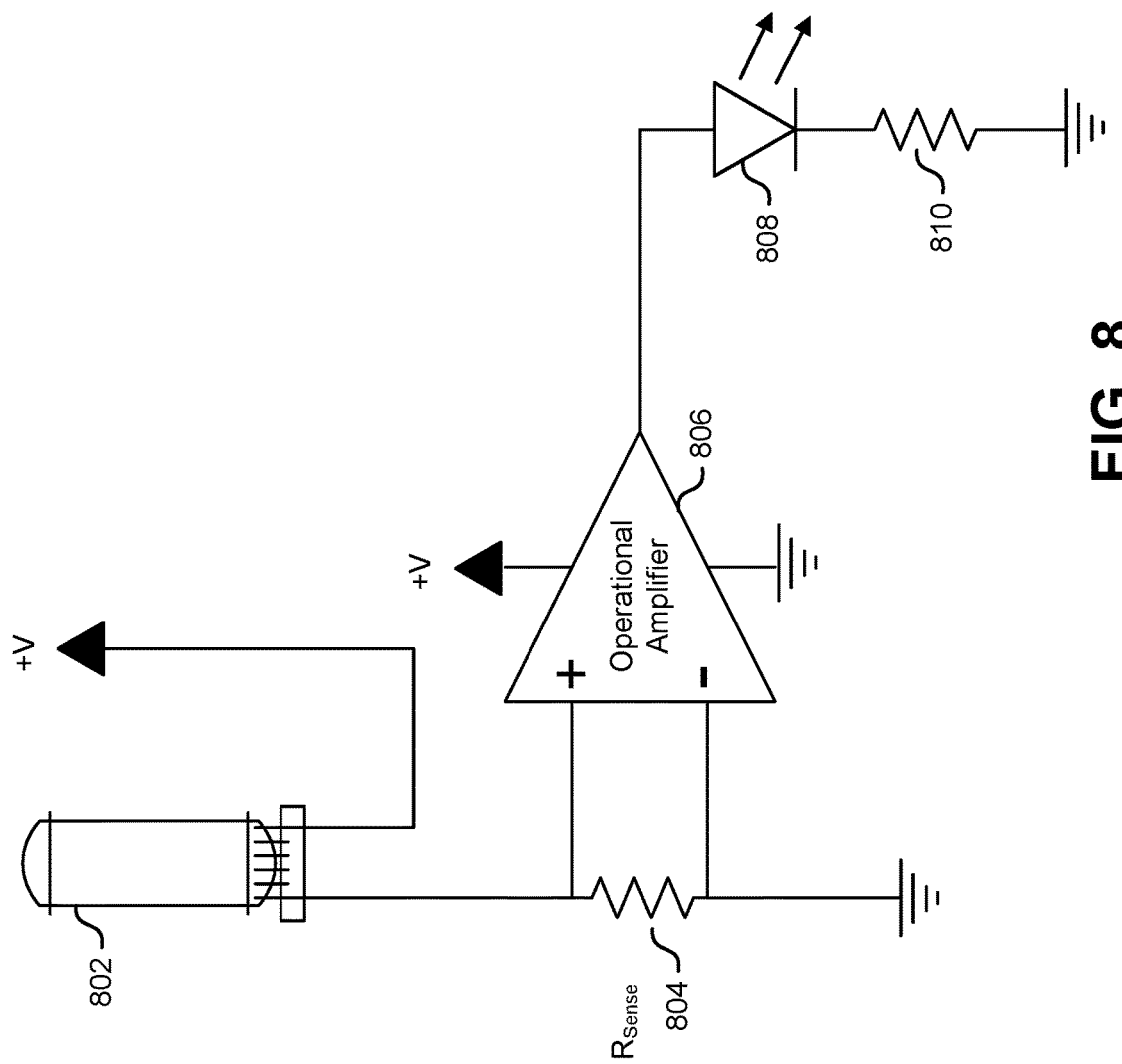
FIG. 8 illustrates an example of a low-side current monitoring circuit that provides an indication of component failure, in accordance with an embodiment.

FIG. 8 illustrates an example of a low-side current monitoring circuit 800 that provides an indication of component failure, in accordance with an embodiment. The heater element of a vacuum tube 802 is connected in series with a sensing resistor 804. The sensing resistor 804 is selected to provide a minimal resistance compared to the resistance of the heater element so as not to reduce the amount of current flowing through the heater. In one implementation, the vacuum tube heater draws a current of roughly 100 mA at a voltage of 6.3 V. If a voltage signal of 100 mV is needed, the sensing resistor 804 can have a value of approximately 1 ohm. The direct measurement of current results in a voltage drop of 0.1V across the vacuum tube heater, which should be tolerable in most applications.

The voltage across the sensing resistor 804 is amplified using an operational amplifier 806. In some implementations, the operational amplifier may be substituted with a current shunt monitor ("CSM"), difference amplifier ("DA"), or instrumentation amplifier ("IA"). The resulting signal is transmitted through the light emitting diode 808 and a current-limiting resistor 810.

So long as current is flowing through the heater of the vacuum tube 802, a small voltage will be present across the sensing resistor 804. This voltage is amplified by the operational amplifier 806 resulting in a current that flows through the light emitting diode 808. If the heater element fails, current through the sensing resistor 804 stops flowing and the voltage across the inputs of the operational amplifier 806 approaches zero. The output of the operational amplifier 806 therefore also approaches zero and current stops flowing through the light emitting diode 808. Therefore, the light emitting diode 808 indicates proper operation of the vacuum tube 802.

With some modifications, the monitoring circuit illustrated in FIG. 8 can be used to monitor multiple components wired in series with the sensing resistor 804. The gain of the operational amplifier 806 can be adjusted with a gain resistor so that the output of the operational amplifier 806 provides a proportional measure of current through the monitored components. The output voltage can be compared with a voltage comparator (possibly constructed with another operational amplifier) in order to provide the desired indication when any single component fails.

Figure 9:
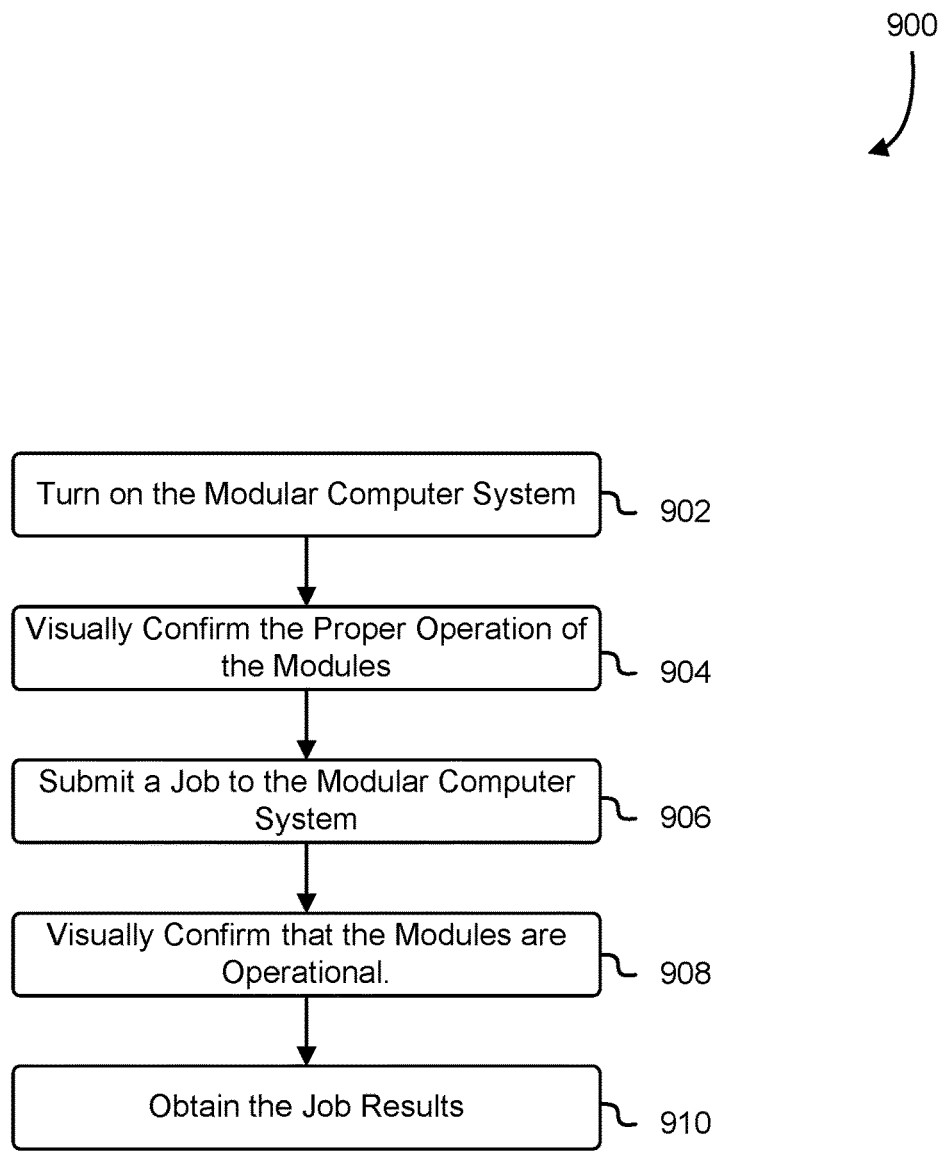
FIG. 9 is a flowchart that illustrates a process for operating a modular computer system that provides a visual indication of component status, in accordance with an embodiment.

FIG. 9 is a flowchart that illustrates a process for confirming the proper operation of a modular computer system that provides a visual indication of component status, in accordance with an embodiment. The monitoring circuitry described herein can be added to a modular computer system to provide a quick confirmation that the computer system is operating properly. In addition, should a particular module fail, the particular module can be quickly identified without removing any modules from the modular computer system for testing. For example, when operating a vacuum-tube-based modular computer system, an operating procedure 900 can be employed.

At block 902, the modular computer system is turned on, and any vacuum tubes are allowed to warm up. At block 904, the operator visually confirms the proper operation of the modules by viewing the status LEDs associated with each module. This can be accomplished without removing any modules from the computer system. If one or more modules is indicated to be failing, the computer system can be turned off and the faulty modules removed and repaired until the status LEDs indicate that all computing modules are operating correctly.

At block 906, the operator submits a job to the modular computer system. Jobs may be submitted via paper tape, magnetic cards, program cards, or teletypewriter interface. Job results may be retrieved via teletypewriter or other interface provided by the modular computer system.

At block 908, after the job is complete, the operator again visually confirms that all modules are properly functioning by observing the LEDs associated with each module. If a module is indicated as having failed, the modules can be identified, repaired, and the job rerun to ensure the correctness of the results produced by the modular computer system.

At block 910, if the circuit modules of the modular computer system are indicated to be properly functioning, the job results can generally be trusted as being free from machine error. By providing the monitoring circuitry described herein, reliable operation of legacy computing systems can be achieved.

Where a system includes computerized devices, each such device can include hardware elements that may be electrically coupled via a bus, the elements including, for example, a central processing unit (CPU or processor), an input device (e.g., a mouse, keyboard, controller, touch screen, or keypad), and an output device (e.g., a display device, printer, or speaker). Such a system may also include one or more storage devices, such as disk drives, optical storage devices, and solid-state storage devices such as random access memory (RAM) or read-only memory (ROM), as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with or configured to receive a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within a working memory device, including an operating system and application programs such as a client application or web browser. In addition, customized hardware might also be used and/or particular elements might be implemented in hardware, software (including portable software, such as applets), or both. Further, connection to other computing devices such as network input/output devices may be employed.

Storage media and computer readable media for containing code, or portions of code, can include any appropriate media known or used in the art, including storage media and communication media, such as, volatile and non-volatile, removable and non-removable media implemented in any method or technology for storage and/or transmission of information such as computer readable instructions, data structures, program modules, or other data, including RAM, ROM, Electrically Erasable Programmable Read-Only Memory (EEPROM), flash memory or other memory technology, Compact Disc Read-Only Memory (CD-ROM), digital versatile disk (DVD), or other optical storage, magnetic cassettes, magnetic tape, magnetic disk storage, or other magnetic storage devices, or any other medium which can be used to store the desired information and which can be accessed by the system device. Based on the disclosure and teachings provided, a person of ordinary skill in the art will appreciate other ways and/or methods to implement the various embodiments.

In the preceding and following description, various techniques are described. For purposes of explanation, specific configurations and details are set forth in order to provide a thorough understanding of possible ways of implementing the techniques. However, it will also be apparent that the techniques described below may be practiced in different configurations without the specific details. Furthermore, well-known features may be omitted or simplified to avoid obscuring the techniques being described.

The specification and drawings are, accordingly, to be regarded in an illustrative rather than a restrictive sense. However, it will be evident that various modifications and changes may be made thereunto without departing from the broader spirit and scope of the invention as set forth in the claims. Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the invention to the specific form or forms disclosed but, on the contrary, the intention is to cover all modifications, alternative constructions, and equivalents falling within the spirit and scope of the invention, as defined in the appended claims.

The use of the terms "a," "an," "the," and similar referents in the context of describing the disclosed embodiments (especially in the context of the following claims) are to be construed to cover both the singular and the plural, unless otherwise indicated or clearly contradicted by context. The terms "comprising," "having," "including," and "containing" are to be construed as open-ended terms (i.e., meaning "including, but not limited to,") unless otherwise noted. The term "connected," where unmodified and referring to physical connections, is to be construed as partly or wholly contained within, attached to, or joined together, even if there is something intervening. Recitation of ranges of values is merely intended to serve as a shorthand method of referring individually to each separate value falling within the range, unless otherwise indicated, and each separate value is incorporated into the specification as if it were individually recited. The use of the term "set" (e.g., "a set of items") or "subset," unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but the subset and the corresponding set may be equal. The use of the phrase "based on," unless otherwise explicitly stated or clear from context, means "based at least in part on" and is not limited to "based solely on."

Conjunctive language, such as phrases of the form "at least one of A, B, and C," or "at least one of A, B and C," is understood with the context as used in general to present that an item, term, etc., may be either A or B or C, or any nonempty subset of the set of A and B and C, unless specifically stated otherwise or otherwise clearly contradicted by context. For instance, in the illustrative example of a set having three members, the conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). The number of items in a plurality is at least two but can be more when so indicated either explicitly or by context.

Operations of processes described can be performed in any suitable order unless otherwise indicated or otherwise clearly contradicted by context. Processes described (or variations and/or combinations thereof) may be performed under the control of one or more computer systems configured with executable instructions and may be implemented as code (e.g., executable instructions, one or more computer programs or one or more applications) executing collectively on one or more processors, by hardware or combinations thereof. The code may be stored on a computer-readable storage medium, for example, in the form of a computer program comprising instructions executable by one or more processors. The computer-readable storage medium may be non-transitory. In some embodiments, the code is stored on a set of one or more non-transitory computer-readable storage media having stored thereon executable instructions that, when executed (i.e., as a result of being executed) by one or more processors of a computer system, cause the computer system to perform operations described herein. The set of non-transitory computer-readable storage media may comprise multiple non-transitory computer-readable storage media, and one or more of individual non-transitory storage media of the multiple non-transitory computer-readable storage media may lack all of the code while the multiple non-transitory computer-readable storage media collectively store all of the code. Further, in some embodiments, the executable instructions are executed such that different instructions are executed by different processors. As an illustrative example, a non-transitory computer-readable storage medium may store instructions. A main CPU may execute some of the instructions and a graphics processor unit may execute other of the instructions. Generally, different components of a computer system may have separate processors, and different processors may execute different subsets of the instructions.

Accordingly, in some embodiments, computer systems are configured to implement one or more services that singly or collectively perform operations of processes described herein. Such computer systems may, for instance, be configured with applicable hardware and/or software that enable the performance of the operations. Further, computer systems that implement various embodiments of the present disclosure may, in some embodiments, be single devices and, in other embodiments, be distributed computer systems comprising multiple devices that operate differently such that the distributed computer system performs the operations described and such that a single device may not perform all operations.

The use of any examples, or exemplary language (e.g., "such as") provided, is intended merely to better illuminate embodiments of the invention and does not pose a limitation on the scope of the invention unless otherwise claimed. No language in the specification should be construed as indicating any non-claimed element as essential to the practice of the invention.

Embodiments of this disclosure are described, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for embodiments of the present disclosure to be practiced otherwise than as specifically described. Accordingly, the scope of the present disclosure includes all modifications and equivalents of the subject matter recited in the claims appended hereto as permitted by applicable law. Moreover, although above-described elements may be described in the context of certain embodiments of the specification, unless stated otherwise or otherwise clear from context these elements are not mutually exclusive to only those embodiments in which they are described; any combination of the above-described elements in all possible variations thereof is encompassed by the scope of the present disclosure unless otherwise indicated or otherwise clearly contradicted by context.

All references, including publications, patent applications, and patents, cited are hereby incorporated by reference to the same extent as if each reference were individually and specifically indicated to be incorporated by reference and were set forth in its entirety.

What is claimed is:

1. An electrical circuit comprising:
    a coil connected in series with a heater of a vacuum tube, the coil having a plurality of turns of wire around a ferrite core, the ferrite core having a slot;
    a Hall effect sensor positioned in the slot to detect a magnetic field generated by the coil; and
    an indicator coupled to the Hall effect sensor that indicates when current is flowing through the heater;
    wherein the vacuum tube is part of a circuit module of a modular computer system; and
    the indicator provides a visible indication of the state of the vacuum tube while the circuit module is installed inside the modular computer system.

2. The electrical circuit of claim 1, wherein:
an output of the Hall effect sensor controls a relay; and
as a result of detecting failure of the vacuum tube, the output of the Hall effect sensor causes the relay to connect a transistor or diode to replace the failed vacuum tube.

3. The electrical circuit of claim 1, wherein the indicator includes a light emitting diode coupled to an output of the Hall effect sensor.

4. The electrical circuit of claim 1, further comprising:
an additional coil wired in series with a second vacuum tube;
wherein the coil and the additional coil share a common core; and
the common core directs a magnetic field to the Hall effect sensor.

5. A computer system having a plurality of pluggable circuit modules, each circuit module comprising:
a heater of a vacuum tube wired in series with a current sensor; and
an indicator mounted on a module and coupled to the current sensor, the indicator observable from outside the computer system and indicating a failure of the vacuum tube when current is not flowing through the heater.

6. The computer system of claim 5, wherein:
the current sensor is implemented by connecting a coil in series with the heater of the vacuum tube;
the coil is magnetically coupled to a Hall effect sensor; and
an output of the Hall effect sensor is coupled to the indicator.

7. The computer system of claim 5, wherein:
the current sensor is implemented using a resistor wired in series with the heater of the vacuum tube, the resistor having a resistance less than 5 percent of the resistance of the heater;
a voltage across the resistor is amplified by an amplifier; and
an output of the amplifier is coupled to the indicator.

8. The computer system of claim 5, wherein:
an output of the current sensor controls a relay; and
as a result of detecting the failure of the vacuum tube, the current sensor causes the relay to connect a second vacuum tube to replace the failed vacuum tube.

9. The computer system of claim 5, wherein:
an output of the current sensor controls a relay; and
as a result of detecting the failure of the vacuum tube, the current sensor causes the relay to connect a transistor or diode to replace the failed vacuum tube.

10. The computer system of claim 5, wherein:
the vacuum tube includes an additional heater;
the additional heater is connected in series with an additional coil; and
the additional coil is magnetically coupled to an additional Hall effect sensor.

11. The computer system of claim 5, wherein:
the vacuum tube includes an additional heater; and
the additional heater is connected in series with the current sensor and the heater.

12. The computer system of claim 5, further comprising:
a carrier circuit board connected to the circuit module, the carrier circuit board including the current sensor; and
a board interconnect that connects the heater to the current sensor.

13. A circuit board monitor assembly comprising:
a carrier assembly capable of being removably attached to a module of a computer system, the module including a component to be monitored;
a current monitor mounted on the carrier assembly, the current monitor connected in series with the component to be monitored; and
an indicator coupled to the current monitor and mounted on the carrier assembly, the indicator visible from outside the computer system while the module is installed in the computer system;
wherein the current monitor is implemented using a resistor wired in series with the component to be monitored, the resistor having a resistance less than 5 percent of the resistance of the component to be monitored;
a voltage across the resistor is amplified by an amplifier; and
an output of the amplifier is coupled to the indicator.

14. The circuit board monitor assembly of claim 13, wherein the component to be monitored is a heater of a vacuum tube.

15. The circuit board monitor assembly of claim 13, wherein:
the current monitor is implemented by connecting a coil in series with the component to be monitored;
the coil is capable of transmitting a magnetic signal to a Hall effect sensor; and
an output of the Hall effect sensor is coupled to the indicator.

16. The circuit board monitor assembly of claim 15, wherein the coil is magnetically coupled to the Hall effect sensor using a slit ferrite core.

17. The circuit board monitor assembly of claim 13, wherein:
the module of the computer system includes a plurality of monitored components; and
the indicator provides an indication when one or more of the monitored components fails.

18. The circuit board monitor assembly of claim 13, wherein the indicator is a light emitting diode, a light bulb, an LCD display, or an LED display.

19. The circuit board monitor assembly of claim 13, wherein the circuit board monitor assembly provides an audible indication of status for the module.

20. The circuit board monitor assembly of claim 13, wherein:
an output of the current monitor controls a relay; and
as a result of detecting the failure of the component, the current monitor causes the relay to connect a replacement component to the computer system.

* * * * *